(12) United States Patent
Triyoso et al.

(10) Patent No.: US 9,466,661 B2
(45) Date of Patent: Oct. 11, 2016

(54) METHOD OF FABRICATING A MIM CAPACITOR WITH MINIMAL VOLTAGE COEFFICIENT AND A DECOUPLING MIM CAPACITOR AND ANALOG/RF MIM CAPACITOR ON THE SAME CHIP WITH HIGH-K DIELECTRICS

(71) Applicant: GLOBALFOUNDRIES Inc., Grand Cayman (KY)

(72) Inventors: Dina Triyoso, Mechanicville, NY (US); Shao-Fu Sanford Chu, Poughkeepsie, NY (US); Bo Yu, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/511,746

(22) Filed: Oct. 10, 2014

(65) Prior Publication Data
US 2016/0104762 A1    Apr. 14, 2016

(51) Int. Cl.
*H01L 49/02* (2006.01)
*H01L 27/08* (2006.01)

(52) U.S. Cl.
CPC .......... *H01L 28/60* (2013.01); *H01L 27/0805* (2013.01)

(58) Field of Classification Search
CPC ............. H01L 27/11; H01L 27/10852; H01L 27/1112; H01L 28/20; H01L 28/40
See application file for complete search history.

(56) References Cited

U.S. PATENT DOCUMENTS

| | | | | |
|---|---|---|---|---|
| 2009/0134493 A1* | 5/2009 | Iwaki | ....................... | H01L 28/55 257/532 |
| 2013/0270675 A1* | 10/2013 | Childs | ................. | H01L 23/5226 257/532 |
| 2014/0159200 A1* | 6/2014 | Loke | .................... | H01L 23/5223 257/532 |
| 2014/0239448 A1* | 8/2014 | Anderson | ............... | H01L 28/60 257/534 |

OTHER PUBLICATIONS

C. Auth et al., "A 22nm High Performance and Low-Power CMOS Technology Featuring Fully-Depleted Tri-Gate Transistors, Self-Aligned Contacts and High Density MIM Capacitors", 2012 Symposium on VLSI Technology Digest of Technical Papers, pp. 131-132.
T. Tsutsumi et al., "New Stacked Metal-Insulator-Metal Capacitor with High Capacitance Density for Future InP-Based ICs", Japanese Journal of Applied Physics 50 (2011) 04DF09, 4 pages.
S. Kim et al., "Engineering of Voltage Nonlinearity in High-K MIM Capacitor for Analog/Mixed-Signal ICs", 2004 Symposium on VLSI Technology Digest of Technical Papers, pp. 218-219.
C. Ng et al., "MIM Capacitor Integration for Mixed-Signal/RF Applications", IEEE Transactions on Electron Devices, vol. 52, No. 7, Jul. 2005, pp. 1399-1409.

* cited by examiner

*Primary Examiner* — Michelle Mandala
(74) *Attorney, Agent, or Firm* — Ditthavong & Steiner, P.C.

(57) ABSTRACT

Methods for fabricating MIM capacitors with low VCC or decoupling and analog/RF capacitors on a single chip and the resulting devices are provided. Embodiments include forming: first and second metal lines in a substrate; a first electrode over, but insulated from, the first metal line; a first high-k dielectric layer on the first electrode, the first high-k dielectric layer having a coefficient α; a second electrode on the first high-k dielectric layer and over a portion of the first electrode; a second high-k dielectric layer on the second electrode, the second high-k dielectric layer having a coefficient α' opposite in polarity but substantially equal in magnitude to α; a third electrode on the second high-k dielectric layer over the entire first electrode; and a metal-filled via through a dielectric layer down to the first metal line, and a metal-filled via through the dielectric layer down to the second metal line.

10 Claims, 14 Drawing Sheets

METHOD OF FABRICATING A MIM CAPACITOR WITH MINIMAL VOLTAGE COEFFICIENT AND A DECOUPLING MIM CAPACITOR AND ANALOG/RF MIM CAPACITOR ON THE SAME CHIP WITH HIGH-K DIELECTRICS

TECHNICAL FIELD

The present disclosure relates to methods of manufacturing semiconductor devices with capacitors. The present disclosure is particularly applicable to metal-insulator-metal (MIM) capacitors.

BACKGROUND

As system-on-chip (SOC) becomes increasingly complex, MIM capacitors play an increasingly critical role in on-chip decoupling, voltage regulation, and analog/radio frequency (RF) circuits. A known approach for forming MIM capacitors includes forming the capacitor with two different insulator materials. However, in this instance, a low voltage coefficient of capacitance (VCC) is achieved at the expense of capacitance density.

In addition, high capacitance density, low leakage MIM capacitors using high dielectric constant (high-k) thin films have been successfully used in high performance complementary metal-oxide-semiconductor (CMOS) logic chips to minimize voltage dropping at the power grids. For many CMOS and bipolar process generations, MIM capacitors have also been an important component in analog/RF circuit blocks. While analog/RF MIM capacitors are less demanding in capacitance density and leakage, they have stringent requirements on low series resistance and voltage and temperature coefficients. Moreover, when both decoupling and analog/RF capacitors are required to be placed on the same chip, e.g., SOC, it is very difficult to build one MIM capacitor that meets both decoupling capacitor (DECAP) MIM and analog/RF MIM requirements. Further, integrating two MIM capacitors, one optimized for decoupling and the other for analog/RF, is usually very complicated and costly.

A need therefore exists for methodology enabling the formation of a stacked MIM capacitor structure that can concurrently achieve a low capacitance density, low leakage, and low VCC as well as a low cost integration scheme to fabricate two MIM capacitors, one optimized for decoupling and the other for analog/RF, in a standard CMOS logic process with only one additional mask.

SUMMARY

An aspect of the present disclosure is a method of forming a stacked MIM capacitor structure that concurrently achieves high capacitance density, low leakage, and low VCC.

An additional aspect of the present disclosure is a method of forming two MIM capacitors in a standard CMOS logic process with one MIM optimized for decoupling capacitor and the other for analog/RF capacitor with only one additional mask.

Another aspect of the present disclosure is a device including a stacked MIM capacitor structure that concurrently achieves high capacitance density, low leakage, and low VCC.

A further aspect of the present disclosure is a device including two MIM capacitors on the same chip, one optimized for decoupling and the other optimized for analog/RF.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first and a second metal line in a substrate and separated from each other; forming a first electrode over, but insulated from, a portion of the first metal line; forming a first high-k dielectric layer over the substrate, including on the first electrode, the first high-k dielectric layer having a quadratic voltage coefficient of capacitance ($\alpha$); forming a second electrode on the first high-k dielectric layer, over a portion of the first electrode between the first and second metal lines and over the second metal line; forming a second high-k dielectric layer over the substrate, including on the second electrode, the second high-k dielectric layer having a coefficient $\alpha'$ opposite in polarity but substantially equal in magnitude to $\alpha$; forming a third electrode on the second high-k dielectric layer over the entire first electrode; forming a via dielectric layer over the substrate; and forming a first metal-filled via through the via dielectric layer, the first and third electrodes, and the first and second high-k dielectric layers, down to the first metal line, and a second metal-filled via through the via dielectric layer, the first and second high-k dielectric layers, and the second electrode, down to the second metal line.

Aspects of the present disclosure include forming the first and the second high-k dielectric layers to a thickness of 1 nanometer (nm) to 20 nm, respectively. Other aspects include forming a second via dielectric layer and a silicon nitride (SiN) cap over the substrate prior to forming the first electrode. Further aspects include forming the first and second metal-filled vias by single damascene or by dual damascene with an upper copper (Cu) metal wiring layer. Another aspect includes forming the first and the second high-k dielectric layers by: forming one of the first and second high-k dielectric layers of hafnium oxide ($HfO_2$), zinconium dioxide ($ZrO_2$), hafnium aluminum oxide (HfAlO), zirconium aluminum oxide (ZrAlO), titanium oxide/silicon oxide ($TiO_2/SiO_2$), zirconium lanthanum oxide/zirconium titanium oxide ($ZrLaO_x/ZrTiO_x$), or gadolinium oxide/europium oxide ($Gd_2O_3/Eu_2O_3$); and forming the other of the first and second high-k dielectric layers of ZrTiO or erbium oxide/silicon oxide ($Er_2O_3/SiO_2$).

Another aspect of the present disclosure is a stacked MIM device including: a first and second metal line formed in a substrate and separated from each other; a first electrode formed over, but insulated from, a portion of the first metal line; a first high-k dielectric layer formed over the substrate, including on the first electrode, the first high-k dielectric layer having a coefficient $\alpha$; a second electrode formed on the first high-k dielectric layer, over a portion of the first electrode between the first and second metal lines and over the second metal line; a second high-k dielectric layer formed over the substrate, including on the second electrode, the second high-k having a coefficient $\alpha'$ opposite in polarity but substantially equally in magnitude to $\alpha$; a third electrode formed on the second high-k dielectric layer over the entire first electrode; a via dielectric layer formed over the substrate; and a first metal-filled via formed through the via dielectric layer, the first and third electrodes and the first and second high-k dielectric layers, down to the first metal line, and a second metal-filled via formed through the via dielectric layer, the first and second high-k dielectric layers, and the second electrode, down to the second metal line.

Aspects of the device include the first and the second high-k dielectric layers being formed to a thickness of 1 nm to 20 nm, respectively. Other aspects include a second via dielectric layer and a SiN cap being formed over the substrate prior to the first electrode being formed. Further aspects include the first and second metal-filled vias being filled with an upper Cu metal wiring layer. Another aspect includes one of the first or the second high-k dielectric layers is formed of $HfO_2$, $ZrO_2$, HfAlO, ZrAlO, $TiO_2/SiO_2$, $ZrLaO_x/ZrTiO_x$, or $Gd_2O_3/Eu_2O_3$ and the other of the first or the second high-k dielectric layer is formed of ZrTiO or $Er_2O_3/SiO_2$.

An additional aspect of the present disclosure is a method including: forming a first, a second, a third, and a fourth metal line in a substrate and separated from each other with the second between the first and third and the third between the second and fourth; forming a first electrode over, but insulated from, a portion of the first metal line; forming a first high-k dielectric layer over the substrate, including on the first electrode, the first high-k dielectric layer meeting a DECAP MIM requirement; forming two second electrodes on the first high-k dielectric layer separated from each other, one formed over a portion of the first electrode between the first and second metal lines and over the second metal line and an other formed over the fourth metal line and a portion of the third metal line; forming a second high-k dielectric layer over the substrate, including on the one second electrode and on the other second electrode, the second high-k layer meeting an analog/RF MIM requirement; forming two third electrodes on the second high-k dielectric layer separated from each other; one formed over the entire first electrode and an other formed over a portion of the other second electrode between the third and fourth metal lines and over the third metal line; forming a via dielectric layer over the substrate; forming a first metal-filled via over the third metal line and through the via dielectric layer, down to the other third electrode and a second metal-filled via over the fourth metal line and through the via dielectric layer, down to the other second electrode; and forming a third metal-filled via through the via dielectric layer, the first and the one third electrode, and the first and second high-k dielectric layers, down to the first metal line, and a fourth metal-filled via through the via dielectric layer, the first and second high-k dielectric layers, and the one second electrode, down to the second metal line.

Aspects of the present disclosure include forming the first and the second high-k dielectric layers to a thickness of 1 nm to 20 nm, respectively. Other aspects include forming a second via dielectric layer and a SiN cap over the substrate prior to forming the first electrode. Further aspects include forming the first, the second, the third, and the fourth metal-filled vias by dual damascene with an upper Cu metal wiring layer. Another aspect includes forming the first and the second high-k dielectric layers by: forming the first high-k dielectric layer of $HfO_2$, $ZrO_2$, HfAlO, ZrAlO, hafnium zinconium oxide (HfZrO), hafnium titanium oxide (HfTiO), ZrTiO, hafnium silicon oxide (HfSiO), zinconium silicon oxide (ZiSiO); and forming the second high-k dielectric layer of aluminum oxide ($Al_2O_3$), tantalum pentoxide ($Ta_2O_5$), hafnium tantalum oxide (HfTaO), hafnium silicon oxide (HfSiO).

A further aspect of the present disclosure is a stacked DECAP MIM and an analog/RF MIM device including: a first, a second, a third, and a fourth metal line formed in a substrate and separated from each other with the second between the first and third and the third between the second and fourth; a first electrode formed over, but insulated from, a portion of the first metal line; a first high-k dielectric formed layer over the substrate, including on the first electrode, the first high-k dielectric layer meeting a DECAP MIM requirement; two second electrodes formed on the first high-k dielectric layer separated from each other, one formed over a portion of the first electrode between the first and second metal lines and over the second metal line, and an other formed over the fourth metal line and a portion of the third metal line; a second high-k dielectric layer formed over the substrate, including on the one second electrode and on the other second electrode, the second high-k layer meeting an analog/RF MIM requirement; two third electrodes formed on the second high-k layer separated from each other, one formed over the entire first electrode, and an other formed over a portion of the other second electrode between the third and fourth metal lines and over the third metal line; a via dielectric layer formed over the substrate; a first metal-filled via formed over the third metal line and through the via dielectric layer, down to the other third electrode, and a second metal-filled via formed over the fourth metal line and through the via dielectric layer, down to the other second electrode; and a third metal-filled via formed through the via dielectric layer, the first and the one third electrode, and the first and second high-k dielectric layers, down to the first metal line, and a fourth metal-filled via formed through the via dielectric layer, the first and second high-k dielectric layers, and the one second electrode, down to the second metal line.

Aspects of the device include the first and the second high-k dielectric layers being formed to a thickness of 1 nm to 20 nm, respectively. Other aspects include a second via dielectric layer and a SiN cap being formed over the substrate prior to the first electrode being formed. Further aspects include the first, the second, the third, and the fourth metal-filled vias are filled with an upper Cu metal wiring layer. Another aspect includes the first high-k dielectric layer being formed of $HfO_2$, $ZrO_2$, HfAlO, ZrAlO, HfZrO, HfTiO, ZrTiO, HfSiO, or ZiSiO, and the second high-k dielectric layer being formed of $Al_2O_3$, $Ta_2O_5$, HfTaO, or HfSiO.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
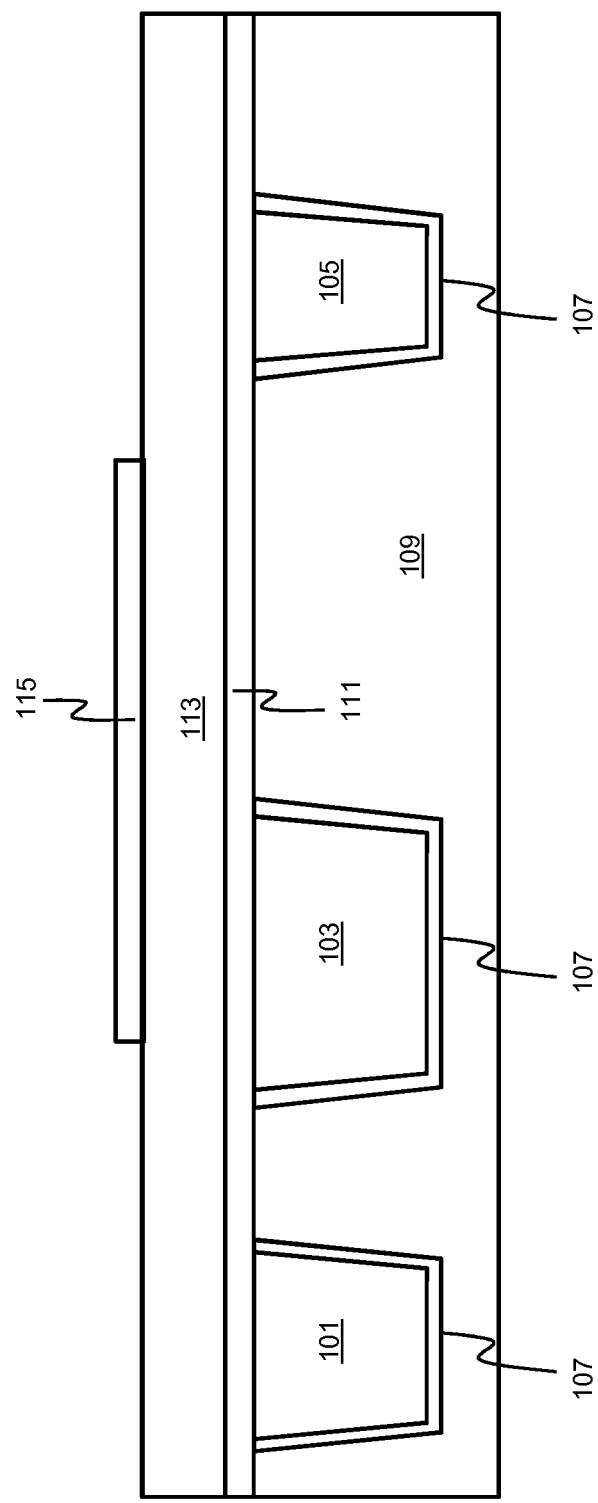
FIGS. 1 through 6 schematically illustrate a process flow for forming a MIM capacitor with a minimal voltage coefficient, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of concurrently satisfying high capacitance density, low leakage, and low VCC attendant using a MIM capacitor for on-chip decoupling, voltage regulation, and analog/RF circuits. The present disclosure also addresses and solves the current problem of satisfying both decoupling and analog/RF requirements attendant upon forming both a DECAP MIM and analog/RF MIM capacitor on the same chip.

Methodology in accordance with embodiments of the present disclosure includes forming a first and a second metal line in a substrate and separated from each other. A first electrode is formed over, but insulated from, a portion of the first metal line. A first high-k dielectric layer is formed over the substrate, including on the first electrode, the first high-k dielectric layer having a coefficient $\alpha$. A second electrode is formed on the first high-k dielectric layer, over a portion of the first electrode between the first and second metal lines and over the second metal line. A second high-k dielectric layer is formed over the substrate, including on the second electrode, the second high-k dielectric layer having a coefficient $\alpha'$ opposite in polarity but substantially equal in magnitude to $\alpha$. A third electrode on the second high-k dielectric layer is formed over the entire first electrode and a via dielectric layer is formed over the substrate. A first metal-filled via is formed through the via dielectric layer, the first and third electrodes, and the first and second high-k dielectric layers, down to the first metal line, and a second metal-filled via is formed through the via dielectric layer, the first and second high-k dielectric layers, and the second electrode, down to the second metal line.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 1, metal lines 101, 103, and 105, e.g., of Cu, each with a liner 107, e.g., of tantalum nitride/tantalum (TaN/Ta), are formed in a substrate 109, in accordance with an exemplary embodiment. Optionally, the formation of metal line 101 may be omitted. Next, a SiN cap 111 is formed, e.g., of a low temperature SiN film, over the substrate 109. A via dielectric layer 113 is then formed, for example, of tetraethyl orthosilicate (TEOS), over the SiN cap 111. Thereafter, an electrode 115 is formed, for example, of TiN, TaN, Ta, or Ru, over a portion of metal line 103 and an adjacent portion of substrate 109 between metal lines 103 and 105. The electrode 115 may be formed, for example, to a thickness of 10 nm to 100 nm, e.g., 50 nm.

Figure 2:
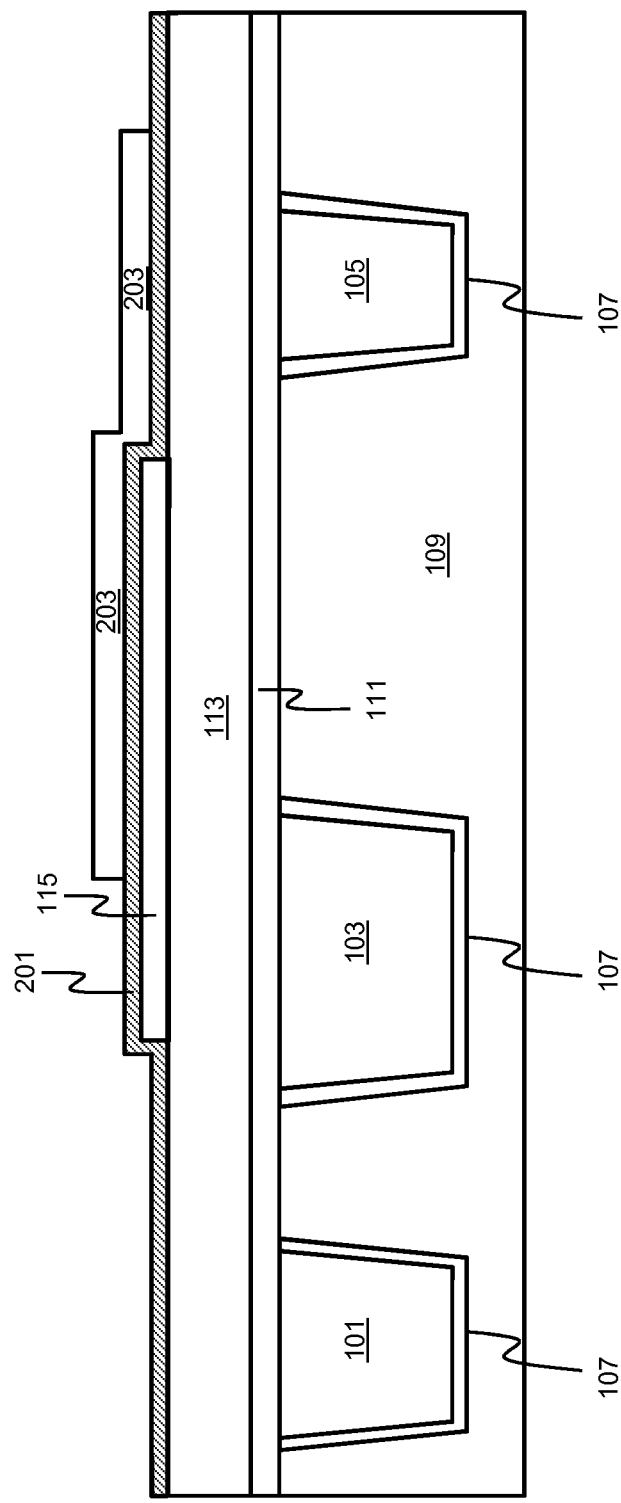

A high-k dielectric layer 201 is formed over the substrate 109, including on the electrode 115, as depicted in FIG. 2. The high-k dielectric layer 201 may be formed, for example, of a high-k dielectric material having a positive coefficient $\alpha$, e.g., HfO$_2$, ZrO$_2$, HfAlO, ZrAlO, TiO$_2$/SiO$_2$, ZrLaO$_x$/ZrTiO$_x$, or Gd$_2$O$_3$/Eu$_2$O$_3$, or of a high-k dielectric material having a negative coefficient $\alpha$, e.g., ZrTiO or Er$_2$O$_3$/SiO$_2$. Further, the high-k dielectric layer 201 may be formed, for example, to a thickness of 1 nm to 20 nm, e.g., 5 nm. The thickness of the high-k dielectric layer 201 is selected based on the dielectric constant of the material, e.g., the higher the dielectric constant, the thicker the material needs to be and vice-versa. Thereafter, an electrode 203 may be formed, for example, on the high-k dielectric layer 201 over a portion of the electrode 115 and over the metal line 105. Similar to electrode 115, electrode 203 may be formed, e.g., of TiN, TaN, Ta, or Ru, and to a thickness of 10 nm to 100 nm, e.g., 50 nm.

Figure 3:
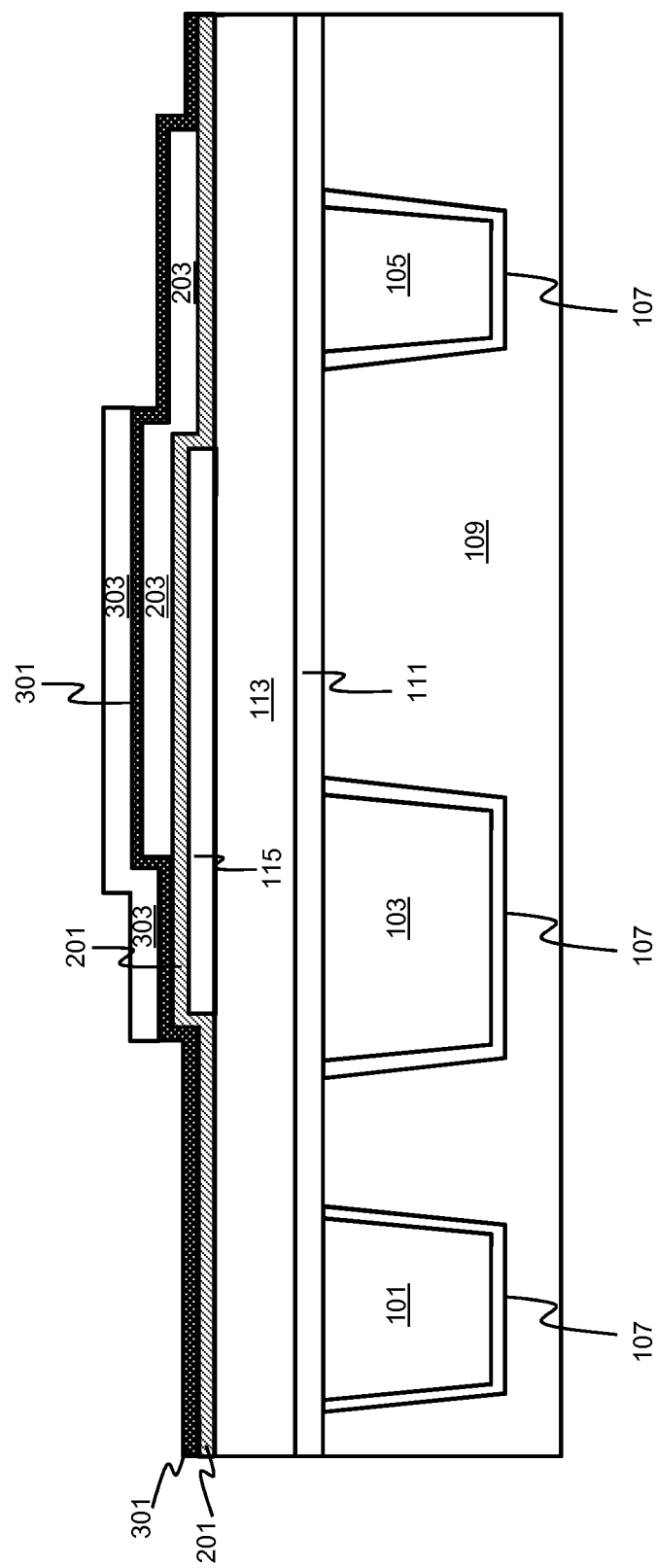
Figure 4:
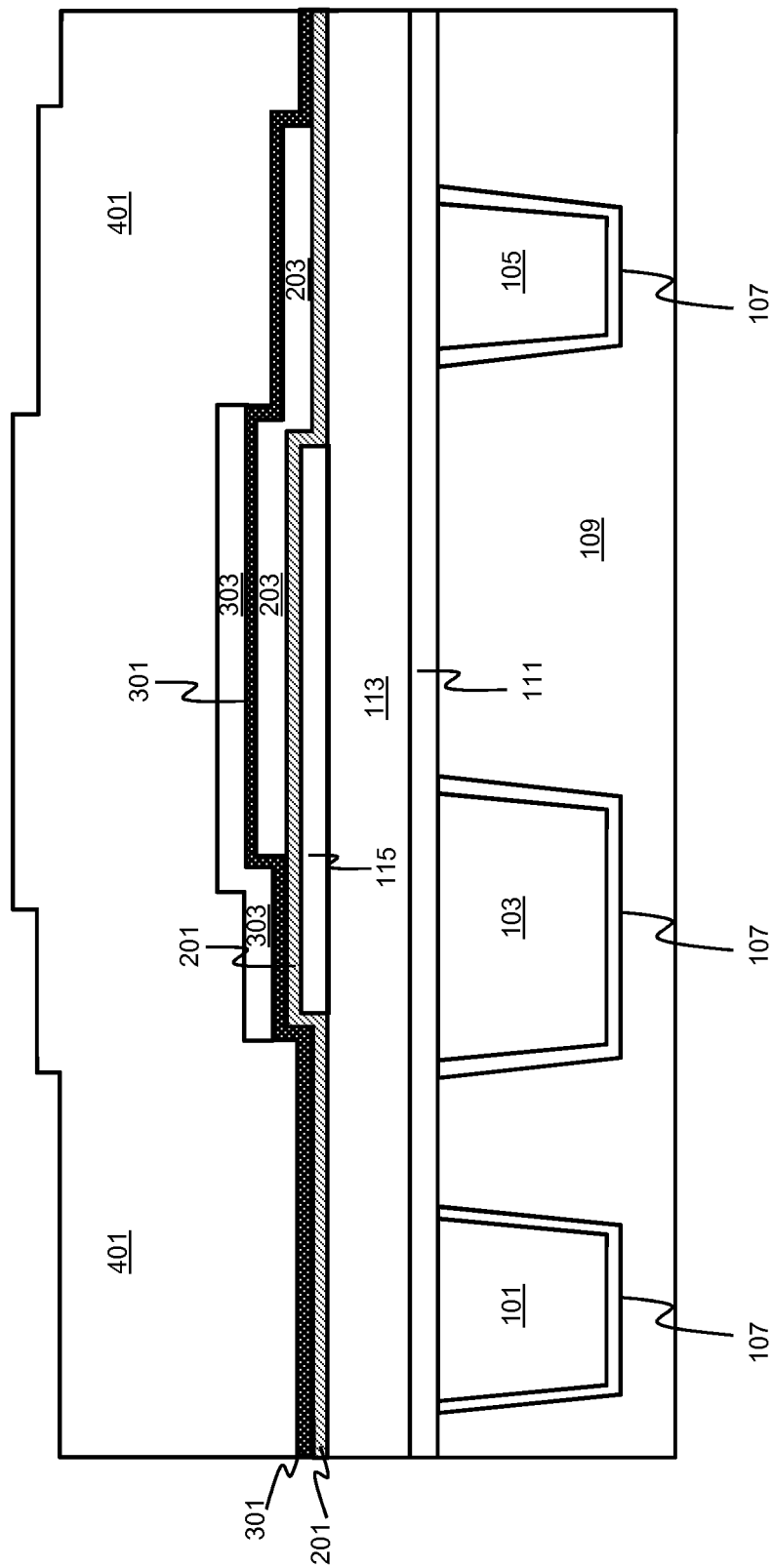
Figure 5:
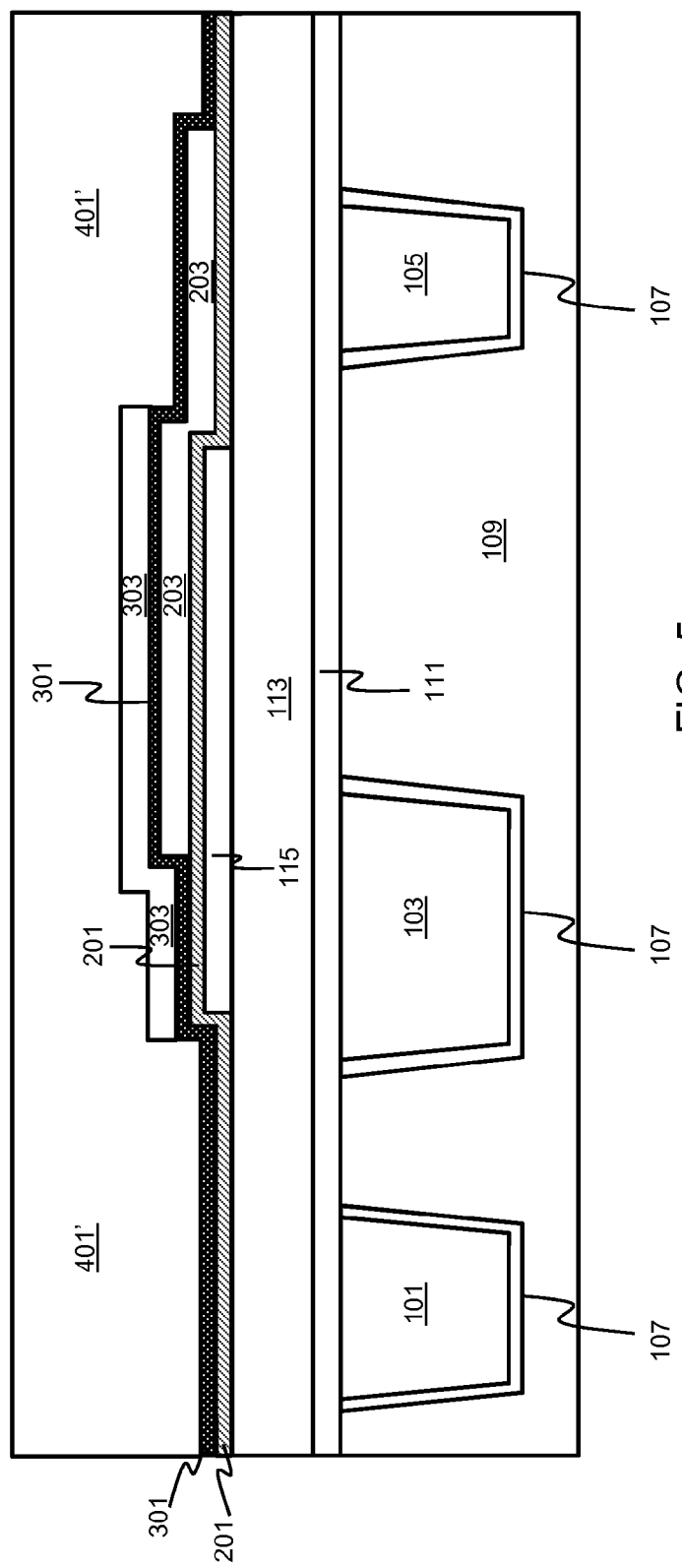

Adverting to FIG. 3, a high-k dielectric layer 301 with a coefficient $\alpha$ opposite to that of high-k dielectric layer 201 is formed over the substrate 109, including on electrode 203. Thereafter, an electrode 303 is formed on the high-k dielectric layer 301 over the entire electrode 115. Similar to electrodes 115 and 203, electrode 303 may be formed, e.g., of TiN, TaN, Ta, or Ru, and to a thickness of 10 nm to 100 nm, e.g., 50 nm. A via dielectric layer 401 is formed, e.g., of TEOS, over the substrate 109, as depicted in FIG. 4. Thereafter, the via dielectric layer 401 is planarized, e.g., by chemical mechanical polishing (CMP), forming via dielectric layer 401', as illustrated in FIG. 5.

Figure 6:
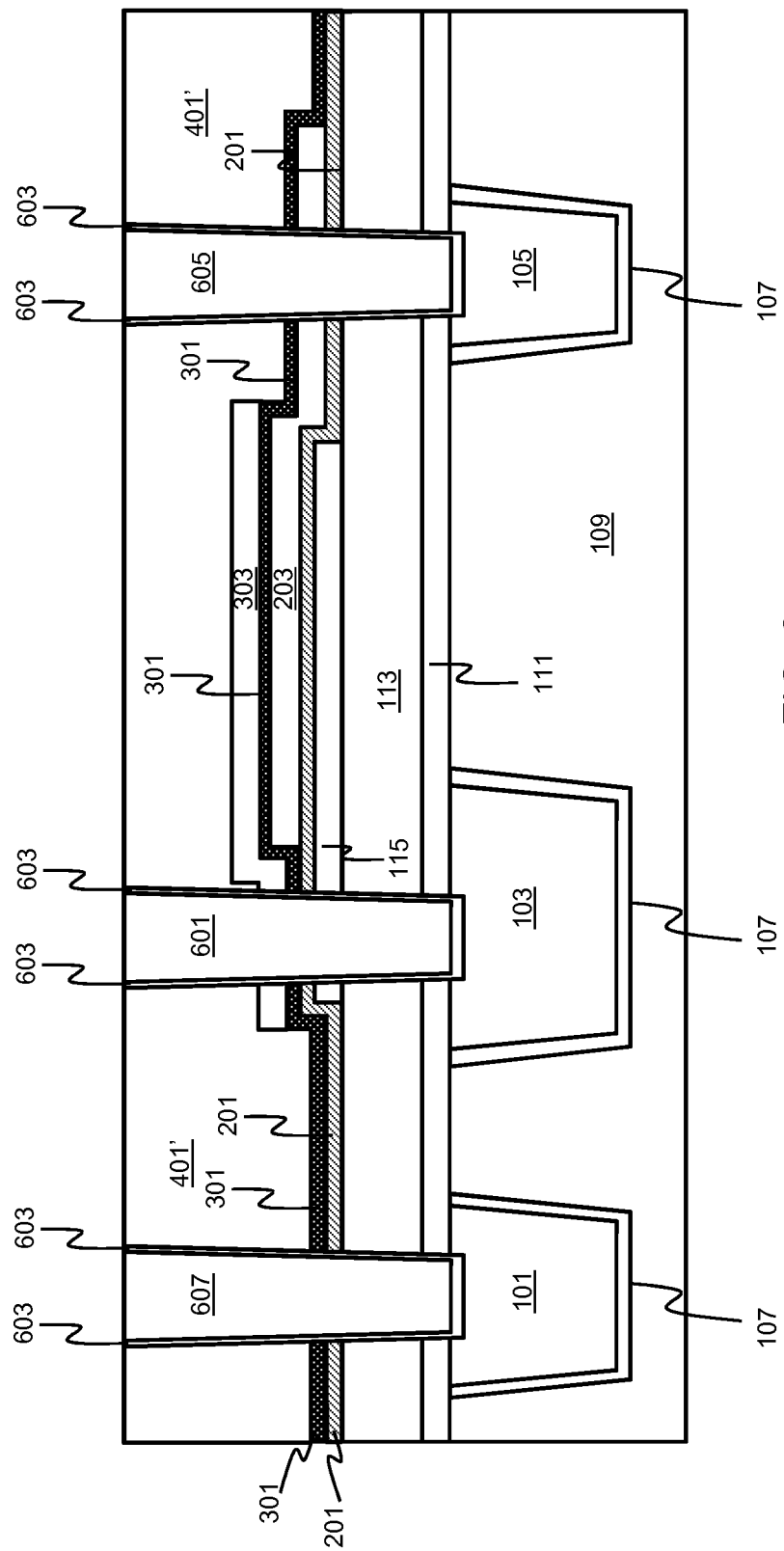
Figure 7:
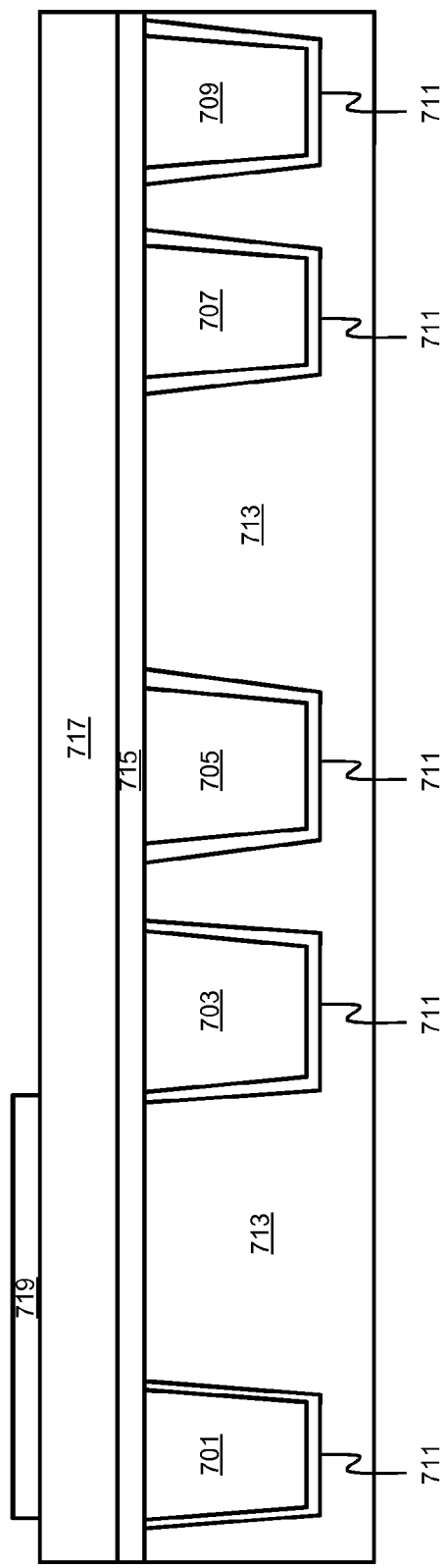
FIGS. 7 through 14 schematically illustrate a process flow for forming a DECAP MIM and analog/RF MIM capacitor on the same chip with high-k dielectrics.
Figure 8:
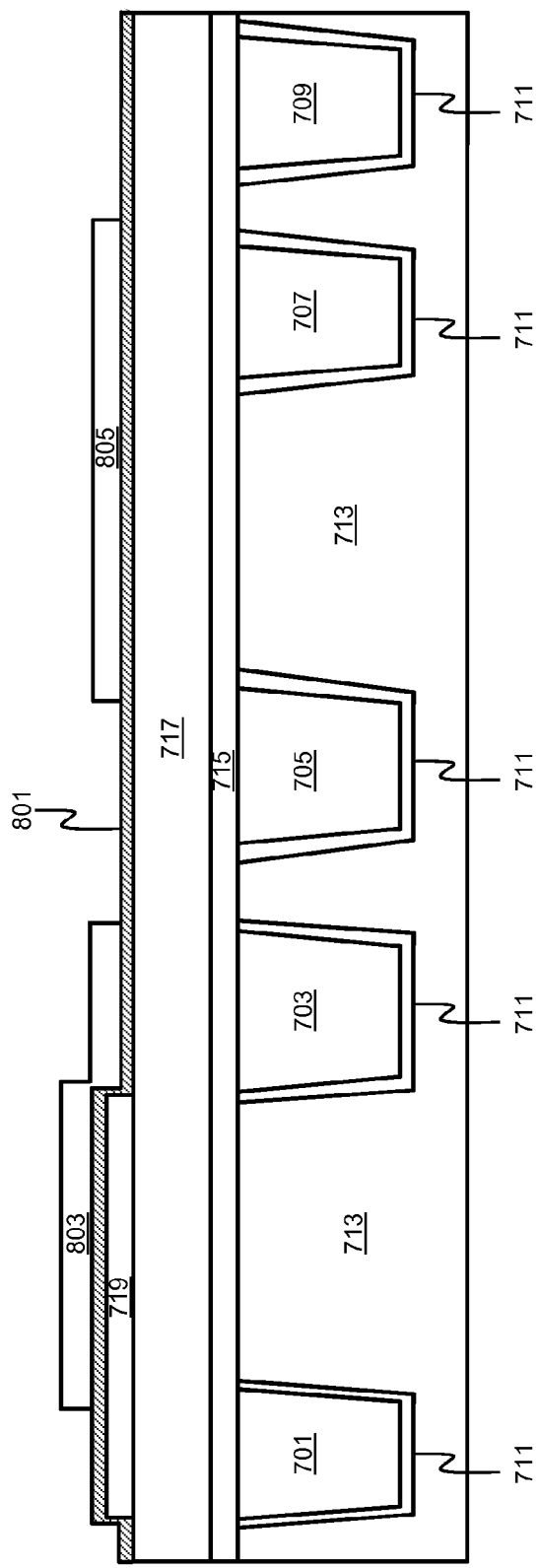

Adverting to FIG. 6, a metal-filled via 601, e.g., filled with Cu and having a liner 603, is formed through the via dielectric layer 401', electrodes 303 and 115, and the high-k dielectric layers 301 and 201, down to the metal line 103. The metal-filled via 601 may be formed, for example, by a single or a dual damascene process. Electrodes 115 and 303 are, therefore, connected together as one plate of the stacked MIM. Similarly, a metal-filled via 605, e.g., filled with Cu and having liner 603, is formed through the via dielectric layer 401', the high-k dielectric layers 301 and 201, and the electrode 203, down to the metal line 105. Then, electrode 203 forms the other plate of the stacked MIM. In addition, a metal-filled via 607 may optionally be formed through the via dielectric layer 401' down to the metal line 101 (if applicable). The capacitor wiring is completed with an upper Cu metal wiring layer (not shown for illustrative convenience), which may be formed as part of the dual damascene process described above.

The total capacitance of the high-k dielectric layers 201 and 301 is the sum of the two MIM capacitors in this structure and, therefore, the total capacitance $(C_0)=C_1+C_2$. In addition, the voltage dependency of the capacitance can be expressed by: $\Delta C/C_0 = \alpha V^2 + \beta V$, where ($\beta$) represents the linear voltage coefficient. As the linear term $\beta V$ can be reduced to zero by differential design techniques, the quadratic term $\alpha V^2$ is the most significant component of the voltage coefficient of capacitance to deal with in many analog circuit design cases. Further, the quadratic voltage coefficient of the stacked capacitor is the sum of the coefficients of the two capacitors: $\alpha = \alpha_1 + \alpha_2$. Consequently, if the dielectric material selected for the two capacitors is such that $\alpha_1$ and $\alpha_2$ have about the same magnitude, but opposite polarities, the resulting a can be very small and approach zero. For example, if the high-k dielectric layer 201 is formed of TiO/SiO$_2$ ($\alpha_1=90$) and the high-k dielectric layer 301 is formed of Er$_2$O$_3$/SiO$_2$ ($\alpha_2=-73$), then coefficient $\alpha=17$. Consequently, the stacked MIM structure as described in FIG. 6 can achieve capacitance density $C_0>20$ fF/um$^2$, leakage (Jg)<100 pA/cm$^2$, and $\alpha$<100 ppm.

FIGS. 7 through 14 schematically illustrate a process flow for forming a DECAP MIM and an analog/RF MIM capacitor on the same chip with high-k dielectrics, in accordance with an exemplary embodiment. Adverting to FIG. 7, metal lines 701, 703, 705, 707, and 709 are formed, e.g., of Cu, each with a liner 711, e.g. of TaN/Ta, in a substrate 713. However, the formation of metal line 709 is optional. Next, a SiN cap 715 is formed, e.g., of a low temperature SiN film, over the substrate 713. A via dielectric layer 717 is then formed, for example, of TEOS, over the SiN cap 715. Thereafter, an electrode 719 is formed, for example, of TiN, TaN, Ta, or Ru, over a portion of metal line 701 and the adjacent substrate between lines 701 and 703. The electrode 719 may be formed, for example, to a thickness of 10 nm to 100 nm, e.g., 50 nm. The electrode 719 is patterned as the bottom plate of the to-be-formed stacked DECAP MIM.

A high-k dielectric layer 801 is formed over the substrate 713, including on electrode 719. The high-k dielectric layer 801 may be formed, for example, of HfO$_2$, ZrO$_2$, HfAlO, ZrAlO, HfZrO, HfTiO, ZrTiO, HfSiO, ZiSiO, or any material meeting a high density/low leakage DECAP requirement. Similar to the high-k dielectric layers 201 and 301, the high-k dielectric layer 801 may be formed, for example, to a thickness of 1 nm to 20 nm, e.g., 5 nm. Thereafter, electrode 803 may be formed, for example, over a portion of electrode 719 between metal lines 701 and 703 and over metal line 703. Electrode 805 may be formed, for example, over metal line 707, a portion of metal line 705, and the space therebetween. Similar to electrode 719, electrodes 803 and 805 may be formed, e.g., of TiN, TaN, Ta, or Ru, and to a thickness of 10 nm to 100 nm, e.g., 50 nm. Electrode 803 is patterned as the middle plate of the stacked DECAP MIM, and electrode 805 is patterned as the bottom plate for the analog/RF MIM.

Figure 9:
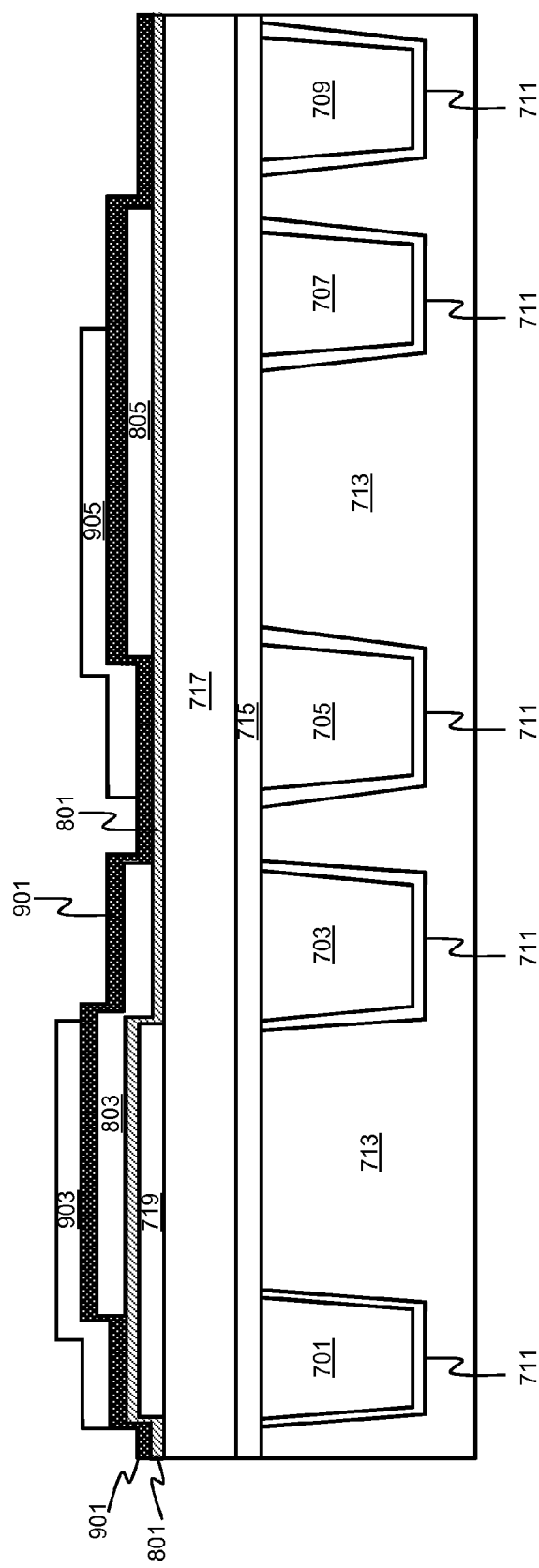

Adverting to FIG. 9, a high-k dielectric layer 901 is formed over the substrate 713, including on electrodes 803 and 805. The high-k dielectric layer 901 may be formed, for example, of Al$_2$O$_3$, Ta$_2$O$_5$, HfTaO, or HfSiO, or any material that meets a good linearity requirement for an analog/RF MIM. Similar to the high-k dielectric layer 801, the high-k dielectric layer 901 may be formed, for example, to a thickness of 1 nm to 20 nm, e.g., 5 nm. Thereafter, electrode 903 may be formed, for example, over the entire electrode 719, and electrode 905 may be formed, for example, over metal line 705 and a portion of electrode 805 between metal lines 705 and 707. Similar to electrodes 719, 803 and 805, electrodes 903 and 905 may be formed, e.g., of TiN, TaN, Ta, or Ru, and to a thickness of 10 nm to 100 nm, e.g., 50 nm. Electrode 903 is patterned as the top plate of the stacked DECAP MIM, and electrode 905 is patterned as the top plate for the analog/RF MIM.

Figure 10:
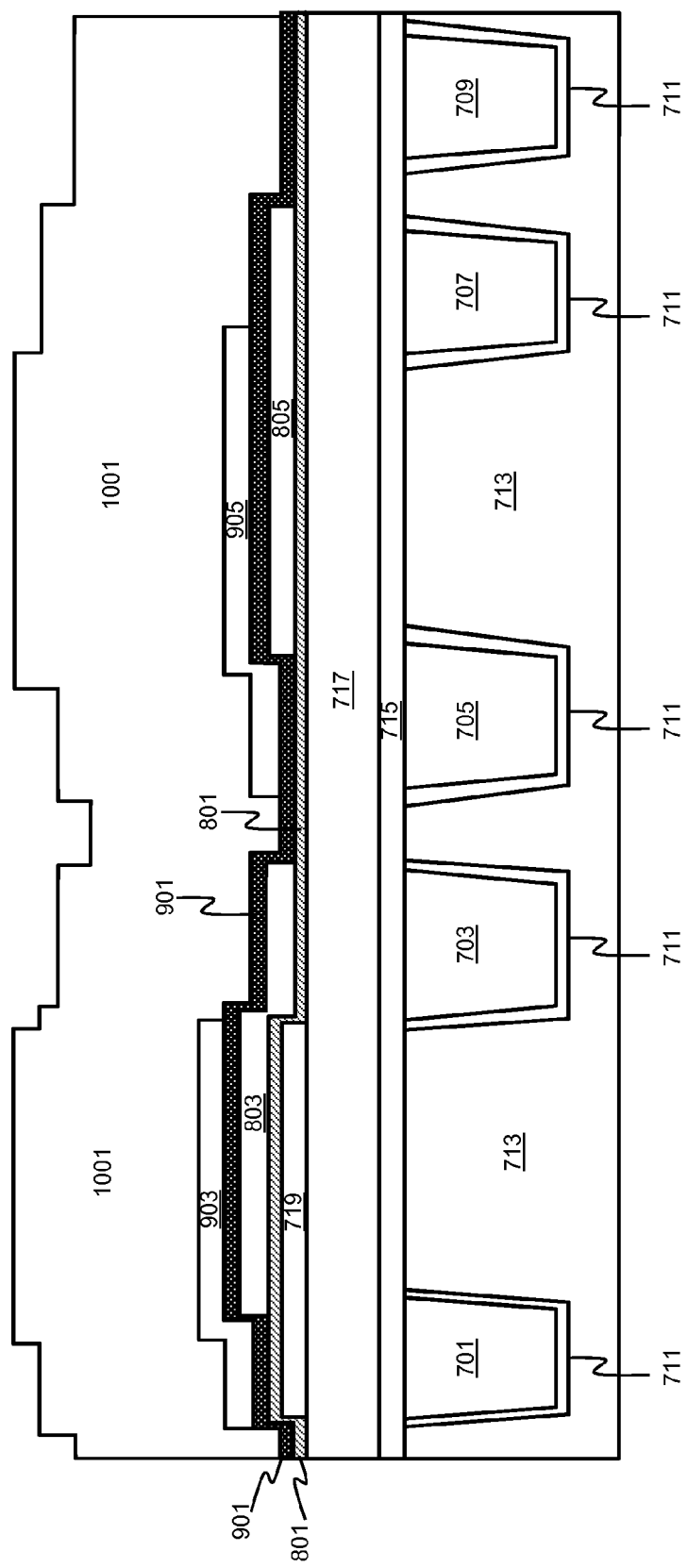
Figure 11:
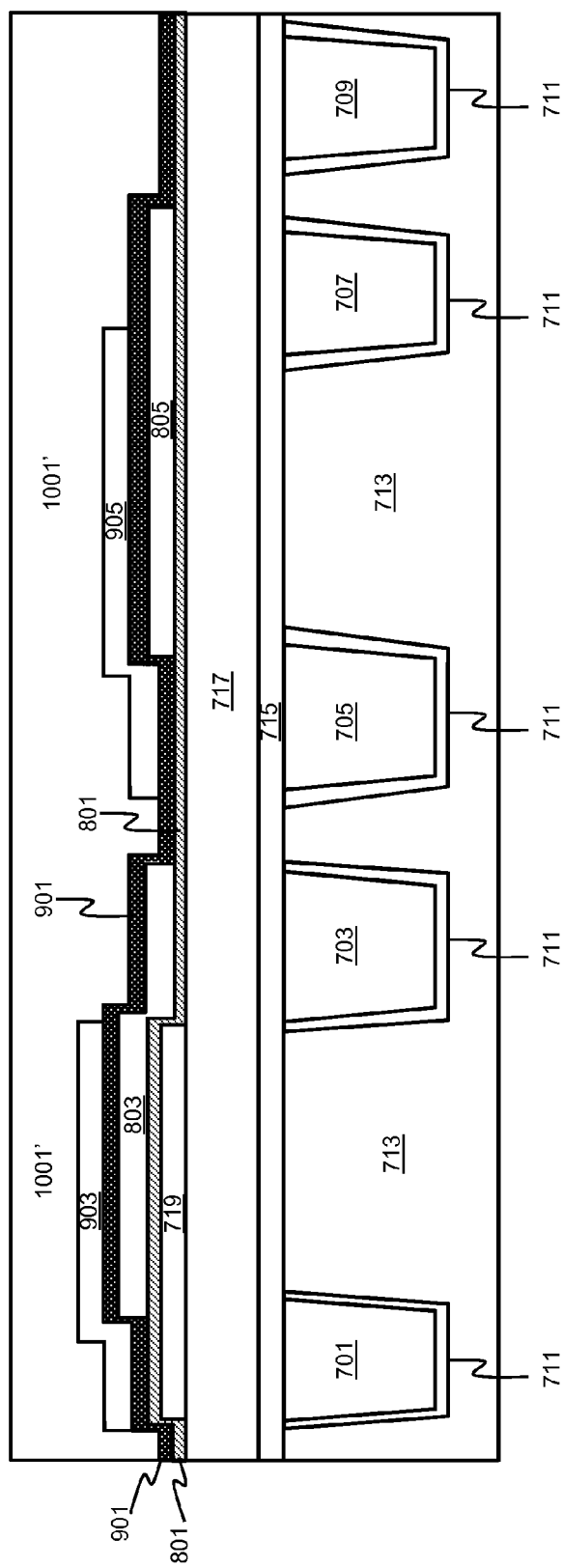
Figure 12:
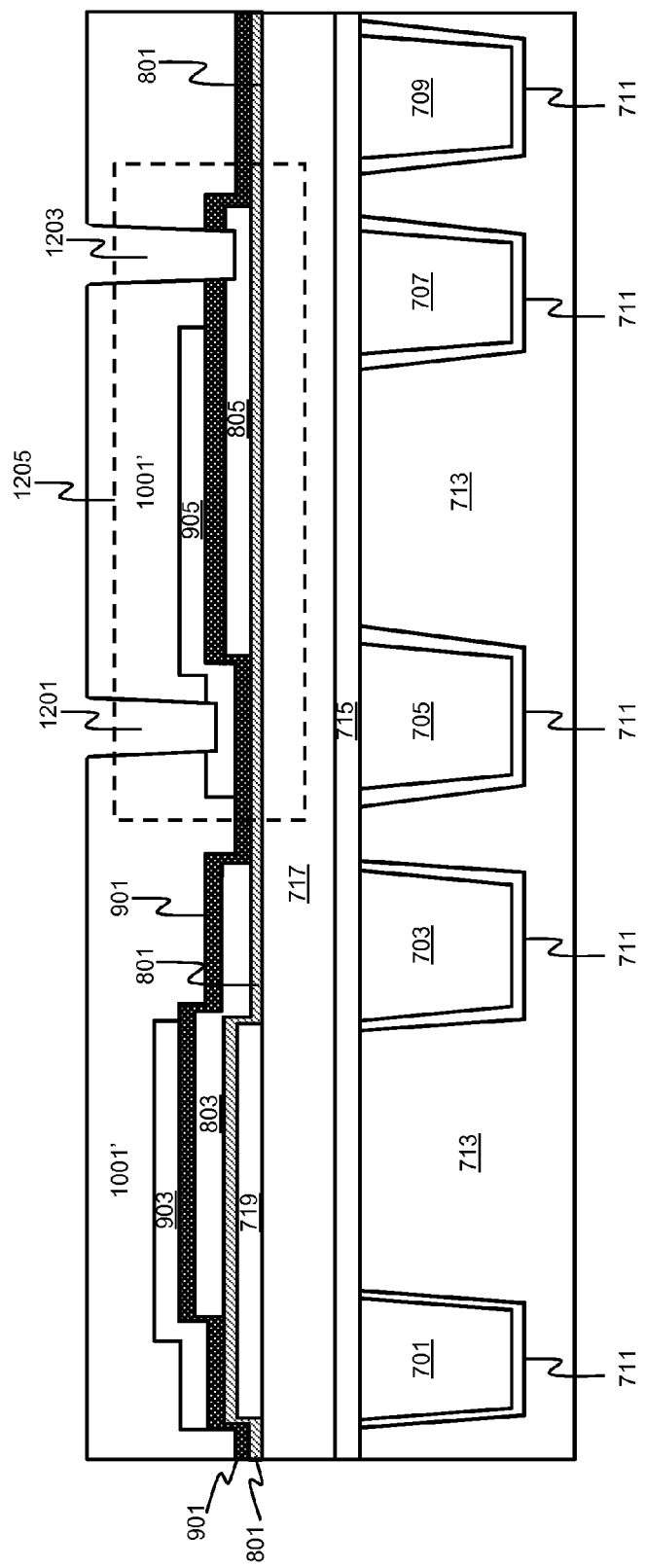
Figure 13:
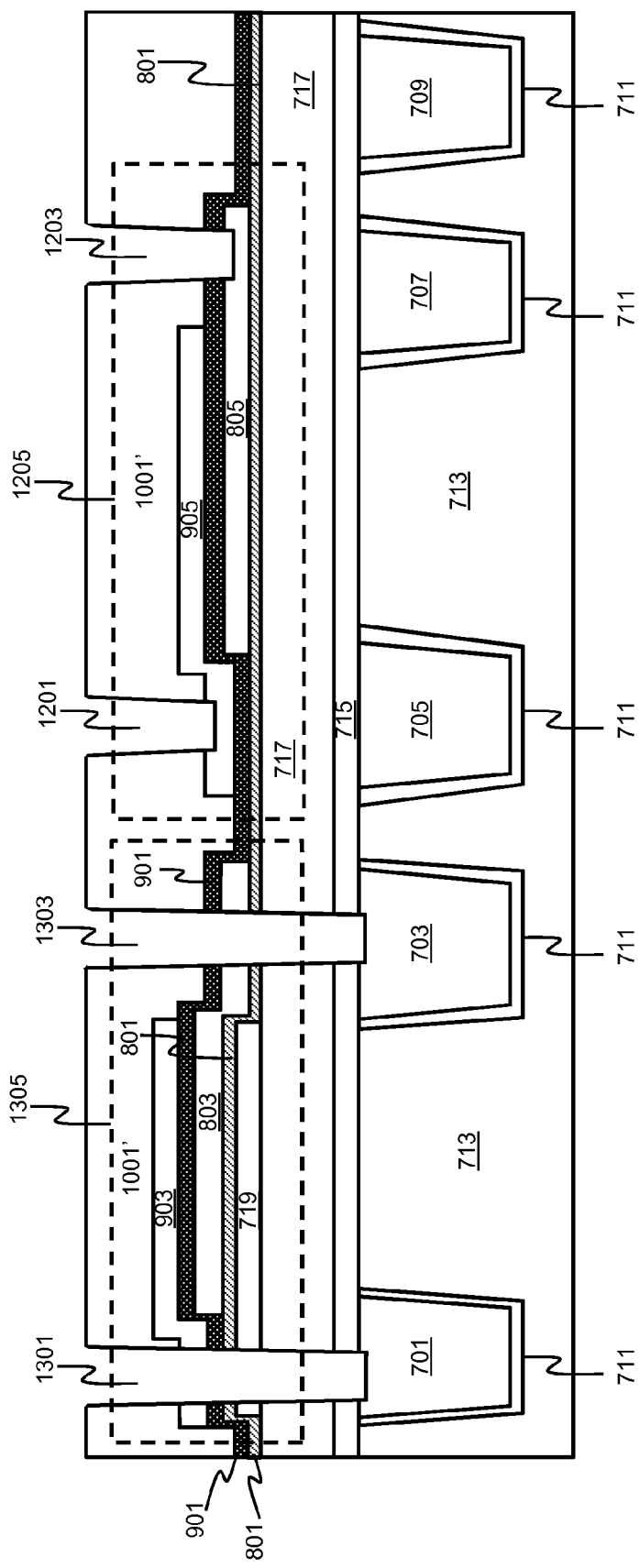

A via dielectric layer 1001 is formed, e.g., of TEOS, over the substrate 713, as illustrated in FIG. 10. Thereafter, the via dielectric layer 1001 is planarized, e.g., by CMP, forming via dielectric layer 1001', as depicted in FIG. 11. Adverting to FIG. 12, trench 1201 is formed through the via dielectric layer 1001', down to electrode 905. Trench 1203 is formed through the via dielectric layer 1001' and the high-k dielectric layer 901, down to the electrode 805. The trenches 1201 and 1203 may be formed, for example, by photo-masking steps, to open contact vias for electrodes 905 and 805, respectively, of the analog/RF MIM, as depicted by the dashed line 1205. Adverting, to FIG. 13, trench 1301 is formed through the via dielectric layer 1001', electrode 903, the high-k dielectric layers 801 and 901, and electrode 719, down to the metal line 701. Similarly, trench 1303 is formed through the via dielectric layer 1001', the high-k dielectric layer 901, electrode 803, and the high-k dielectric layer 801, down to the metal line 703. The trenches 1301 and 1303 may be formed, for example, by baseline contact steps, to open contact vias for electrodes 903 and 719 and 803, respectively, of the DECAP MIM, as depicted by the dashed line 1305. It may be possible to simultaneously form trenches 1201, 1203, 1301, and 1303.

Figure 14:
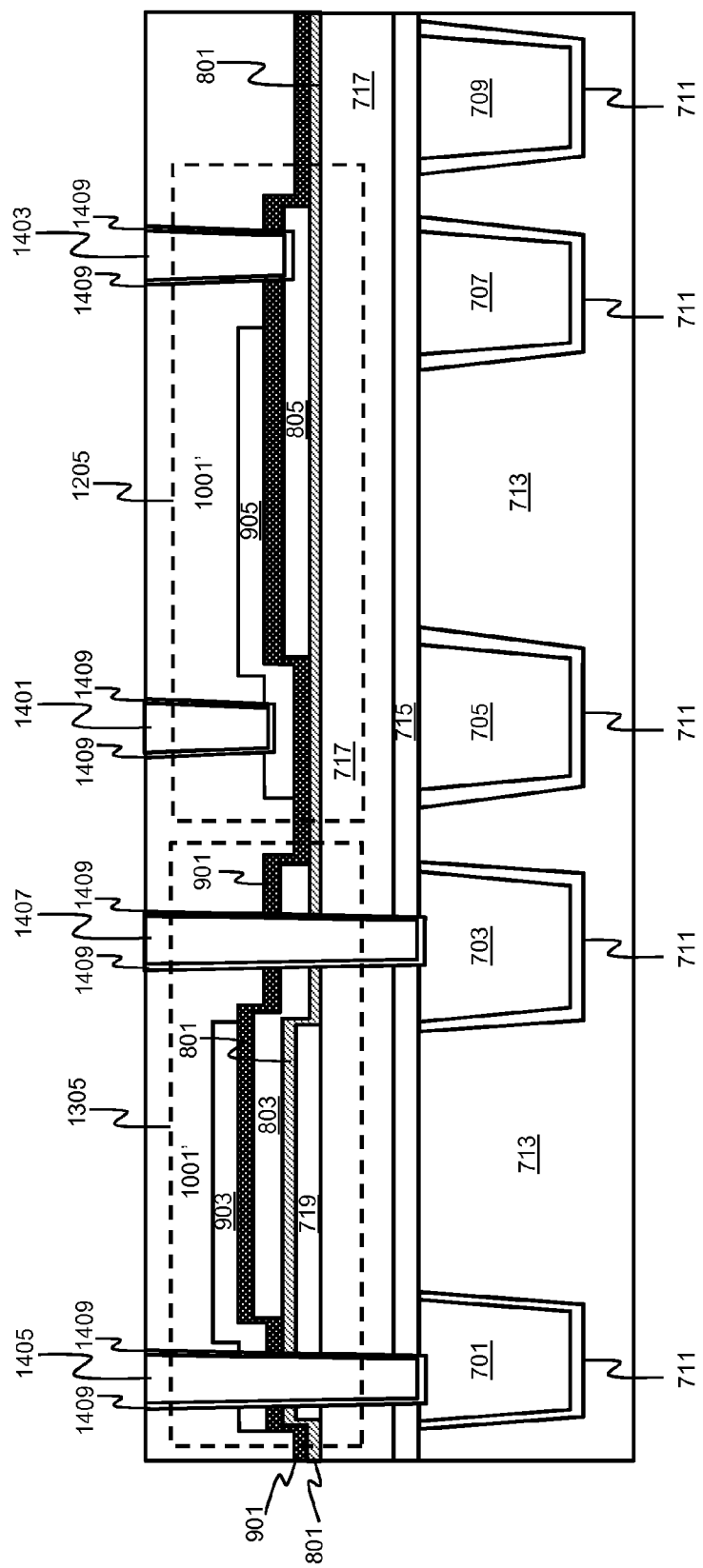

Adverting to FIG. 14, metal-filled vias 1401, 1403, 1405, and 1407, e.g., filled with Cu and each having a liner 1409, are formed in trenches 1201, 1203, 1301, and 1303, respectively. The metal-filled vias 1401 through 1407 may be formed, for example, by a dual damascene process, which completes the capacitor wiring with an upper Cu metal wiring layer (not shown for illustrative convenience). As previously mentioned, electrodes 719 and 903 are connected together as one plate of the stacked DECAP MIM, and electrode 803 is the common electrode in the middle of the DECAP MIM. The net capacitance of the structure is the sum of the two stacked MIMs. In addition, the electrodes 719, 803, 805, 903, and 905 are contacted by the sidewall region of the plugs of vias 1405, 1407, 1401, and 1403. Further, electrodes 905 and 805 are the top and bottom plates, respectively, of the analog/RF MIM. The MIM electrodes can be contacted by multiple vias in large numbers to reduce contact resistance. Further, whereas three (3) masks are typically required to form a single DECAP MIM, the steps of FIGS. 7 through 14 described herein require only four (4) masks, i.e., only one additional mask, to fabricate both a DECAP MIM and an analog/RF MIM on the same chip.

The embodiments of the present disclosure can achieve several technical effects including a MIM capacitor that can concurrently achieve high capacitance density, low leakage, and a low coefficient $\alpha$. In addition, the present disclosure can achieve several further technical effects including two MIM capacitors formed in a standard CMOS logic process using one MIM optimized for a decoupling capacitor and another for an analog/RF capacitor with only one additional mask. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure is particular applicable to semiconductor devices having decoupling MIM capacitors and/or analog/RF MIM capacitors.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming a first, a second and a third metal line in a substrate and separated from each other;
   forming a first electrode over, but insulated from, a portion of the first metal line;

forming a first high-k dielectric layer over the substrate, including on the first electrode, the first high-k dielectric layer having a quadratic voltage coefficient of capacitance (α);
forming a second electrode on the first high-k dielectric layer, over a portion of the first electrode between the first and second metal lines and over the second metal line;
forming a second high-k dielectric layer over the substrate, including on the second electrode, the second high-k dielectric layer having a coefficient α' opposite in polarity but substantially equal in magnitude to α;
forming a third electrode on the second high-k dielectric layer over the entire first electrode;
forming a via dielectric layer over the substrate; and
forming a first metal-filled via through the via dielectric layer, the first and third electrodes, and the first and second high-k dielectric layers, down to the first metal line, a second metal-filled via through the via dielectric layer, the first and second high-k dielectric layers, and the second electrode, down to the second metal line, and a third metal-filled via through the via dielectric layer, and the first and second high-k dielectric layers, down to the third metal line, wherein the third metal-filled via does not pass through any electrode.

2. The method according to claim 1, comprising forming the first and the second high-k dielectric layers to a thickness of 1 nanometer (nm) to 20 nm, respectively.

3. The method according to claim 1, comprising forming a second via dielectric layer and a silicon nitride (SiN) cap over the substrate prior to forming the first electrode.

4. The method according to claim 1, comprising forming the first and second metal-filled vias by single damascene or by dual damascene with an upper copper (Cu) metal wiring layer.

5. The method according to claim 1, comprising forming the first and the second high-k dielectric layers by:
forming one of the first and second high-k dielectric layers of hafnium oxide ($HfO_2$), zinconium dioxide ($ZrO_2$), hafnium aluminum oxide (HfAlO), zirconium aluminum oxide (ZrAlO), titanium oxide/silicon oxide ($TiO_2/SiO_2$), zirconium lanthanum oxide/zirconium titanium oxide ($ZrLaO_x/ZrTiO_x$), or gadolinium oxide/europium oxide ($Gd_2O_3/Eu_2O_3$); and
forming the other of the first and second high-k dielectric layers of ZrTiO or erbium oxide/silicon oxide ($Er_2O_3/SiO_2$).

6. A stacked metal-insulator-metal (MIM) device comprising:
a first, a second and third metal line formed in a substrate and separated from each other;
a first electrode formed over, but insulated from, a portion of the first metal line;
a first high-k dielectric layer formed over the substrate, including on the first electrode, the first high-k dielectric layer having a quadratic voltage coefficient of capacitance (a);
a second electrode formed on the first high-k dielectric layer, over a portion of the first electrode between the first and second metal lines and over the second metal line;
a second high-k dielectric layer formed over the substrate, including on the second electrode, the second high-k having a coefficient α' opposite in polarity but substantially equally in magnitude to α;
a third electrode formed on the second high-k dielectric layer over the entire first electrode;
a via dielectric layer formed over the substrate; and
a first metal-filled via formed through the via dielectric layer, the first and third electrodes and the first and second high-k dielectric layers, down to the first metal line, a second metal-filled via formed through the via dielectric layer, the first and second high-k dielectric layers, and the second electrode, down to the second metal line, and a third metal-filled via through the via dielectric layer, and the first and second high-k dielectric layers, down to the third metal line, wherein the third metal-filled via does not pass through any electrode.

7. The device according to claim 6, wherein the first and the second high-k dielectric layers are formed to a thickness of 1 nanometer (nm) to 20 nm, respectively.

8. The device according to claim 6, further comprising a second via dielectric layer and a silicon nitride (SiN) cap formed over the substrate prior to the first electrode being formed.

9. The device according to claim 6, wherein the first and second metal-filled vias are filled with an upper copper (Cu) metal wiring layer.

10. The device according to claim 6, wherein one of the first or the second high-k dielectric layers is formed of hafnium oxide ($HfO_2$), zinconium dioxide ($ZrO_2$), hafnium aluminum oxide (HfAlO), zirconium aluminum oxide (ZrAlO), titanium oxide/silicon oxide ($TiO_2/SiO_2$), zirconium lanthanum oxide/zirconium titanium oxide ($ZrLaO_x/ZrTiO_x$), or gadolinium oxide/europium oxide ($Gd_2O_3/Eu_2O_3$) and the other of the first or the second high-k dielectric layer is formed of ZrTiO or erbium oxide/silicon oxide ($Er_2O_3/SiO_2$).

* * * * *